(12) United States Patent
Fan et al.

(10) Patent No.: US 11,418,025 B2
(45) Date of Patent: Aug. 16, 2022

(54) DEVICE AND METHOD FOR ELECTROSTATIC DISCHARGE PROTECTION

(71) Applicants: TAIWAN SEMICONDUCTOR MANUFACTURING CO., LTD., Hsinchu (CN); TSMC CHINA COMPANY LIMITED, Shanghai (CN)

(72) Inventors: Hang Fan, Shanghai (TW); Ming-Fang Lai, Hsinchu (TW); Shui-Ming Cheng, Hsinchu County (TW)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 17/102,224

(22) Filed: Nov. 23, 2020

(65) Prior Publication Data

US 2022/0140599 A1 May 5, 2022

(30) Foreign Application Priority Data

Nov. 3, 2020 (CN) .......................... 202011208888.X

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC ............................ H02H 9/046; H01L 27/0248

USPC ............................................................ 361/56
See application file for complete search history.

(56) References Cited

U.S. PATENT DOCUMENTS

| 5,671,111 | A | * | 9/1997 | Chen | ...................... | H02H 9/046 361/111 |
| 2005/0264963 | A1 | * | 12/2005 | Sato | ................... | H01L 27/0262 361/56 |
| 2007/0201173 | A1 | | 8/2007 | Chu et al. | | |
| 2016/0020606 | A1 | * | 1/2016 | Kato | ....................... | H03K 17/22 361/56 |
| 2018/0026029 | A1 | | 1/2018 | Lin | | |
| 2018/0374839 | A1 | | 12/2018 | Tsai et al. | | |
| 2019/0080769 | A1 | | 3/2019 | Shiraishi et al. | | |
| 2019/0190256 | A1 | * | 6/2019 | Agarwal | ............. | H02H 1/0007 |

(Continued)

FOREIGN PATENT DOCUMENTS

| CN | 109509504 A | 3/2019 |
| TW | 201906132 A | 2/2019 |
| TW | 201935657 A | 9/2019 |

*Primary Examiner* — Dharti H Patel
(74) *Attorney, Agent, or Firm* — Maschoff Brennan

(57) ABSTRACT

A device is disclosed herein. The device includes an electrostatic discharge (ESD) protection switch and an ESD driver. The ESD driver is configured to receive a first voltage and a second voltage. When a voltage difference between the first voltage and the second voltage is higher than a first voltage threshold, the ESD driver outputs a first trigger signal to turn on the ESD protection switch. When the voltage difference between the first voltage and the second voltage is lower than a second voltage threshold, the ESD driver outputs a second trigger signal to turn on the ESD protection switch.

20 Claims, 5 Drawing Sheets

(56) References Cited

U.S. PATENT DOCUMENTS

2019/0237456 A1\* 8/2019 Lai ..................... H01L 27/0288
2020/0251466 A1  8/2020 Stockinger \* cited by examiner

DEVICE AND METHOD FOR ELECTROSTATIC DISCHARGE PROTECTION

RELATED APPLICATIONS

This application claims priority to China Application Serial Number 202011208888.X, filed on Nov. 3, 2020, which is herein incorporated by reference in its entirety.

BACKGROUND

Gallium nitride (GaN) based devices have been widely applied in commercial applications, in particular, in high-power applications. However, it is difficult to manufacture an electrostatic discharge (ESD) protection system, which is able to deal with bidirectional ESD current, with the foregoing GaN based devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
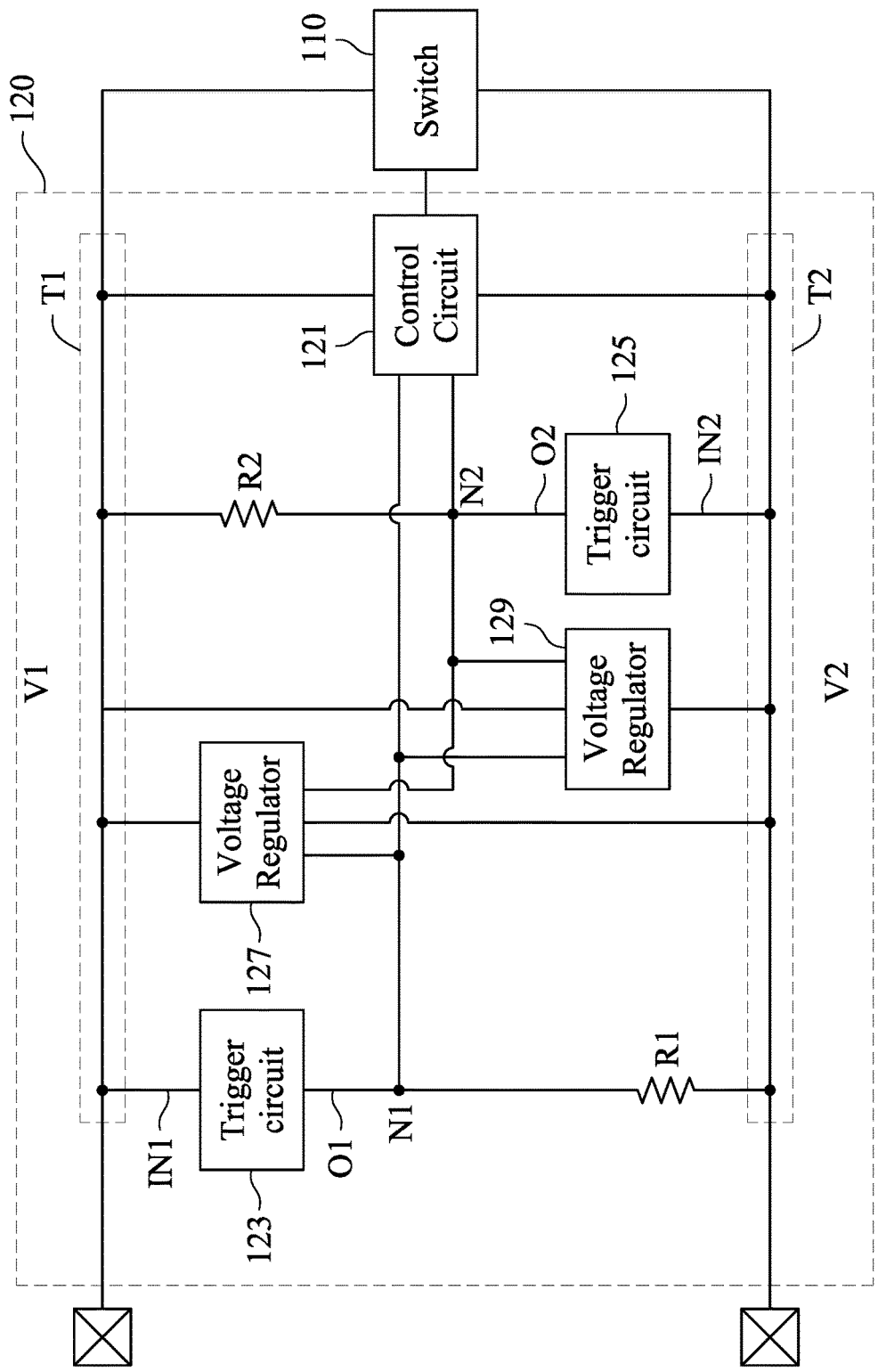
FIG. 1 is a block diagram of an electrostatic discharge (ESD) protection device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Reference is now made to FIG. 1. FIG. 1 is a block diagram of an electrostatic discharge (ESD) protection device 100 in accordance with some embodiments.

As illustratively shown in FIG. 1, the ESD protection device 100 includes an ESD protection switch 110 and an ESD driver 120. In some embodiments, the ESD protection device 100 is used to protect an electronic device (not shown) from being damaged, and the protection manner will be described in detail in the following paragraphs.

In some embodiments, when an ESD event occurs, the ESD driver 120 of the ESD protection device 100 is configured to turn on the ESD protection switch 110. Therefore, an overvoltage introduced by an ESD event can be conducted to ground or virtual ground in order to prevent an electronic device from being damaged by the above-mentioned overvoltage.

Figure 2:
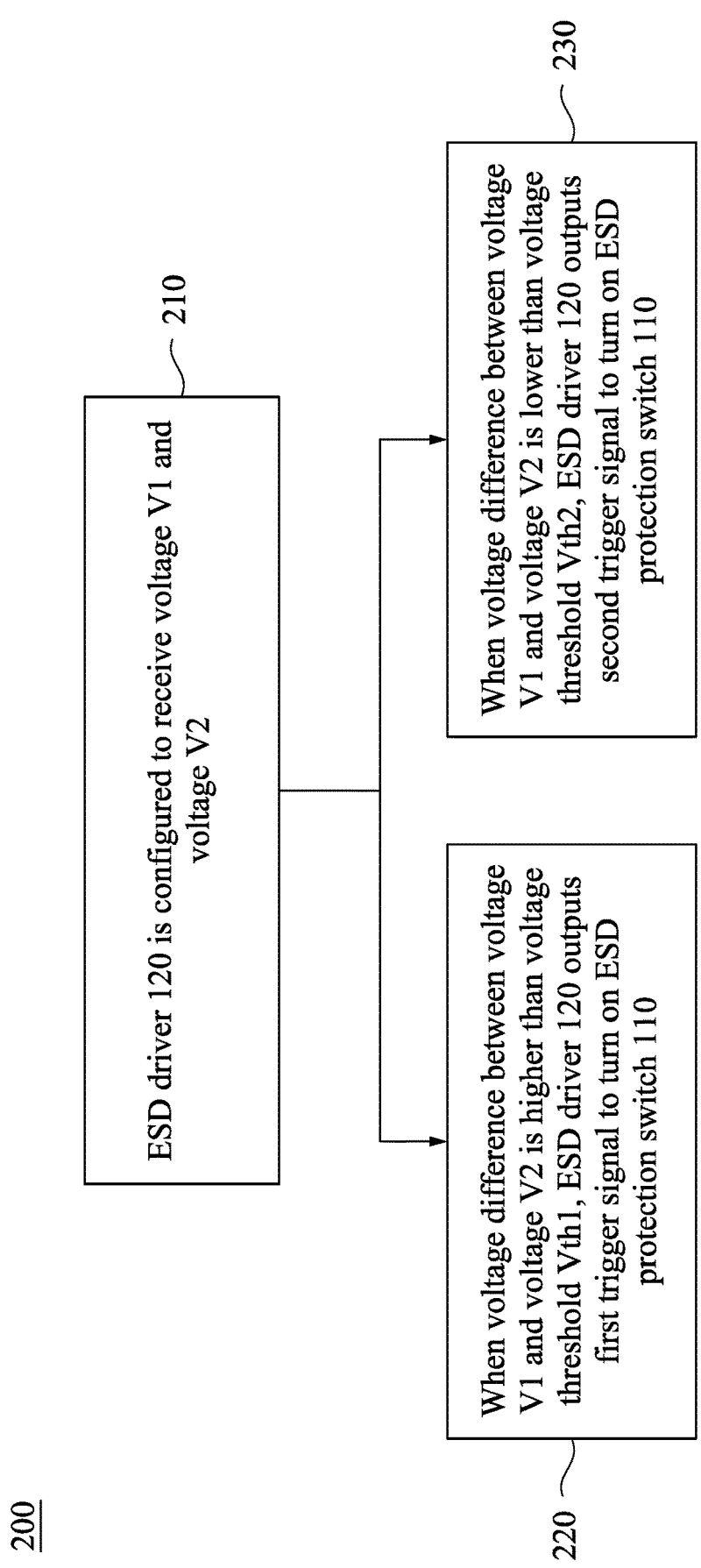
FIG. 2 is a flow chart of a method for operating the ESD protection device as shown in FIG. 1 in accordance with various embodiments of the present disclosure.

Reference is now made to FIG. 2. FIG. 2 is a flow chart of a method 200 for operating the ESD protection device 100 in FIG. 1, in accordance with various embodiments of the present disclosure. For illustration, the operations of the ESD protection device 100 in FIG. 1 are described by the method 200.

With reference to the method 200 in FIG. 2, in operation 210, the ESD driver 120 is configured to receive a voltage V1 and a voltage V2. In some embodiments, the ESD protection device 100 is implemented in an input of an electronic device for preventing the electronic device from being damaged by an overvoltage which is introduced by an ESD event. Terminals T1, T2 of the ESD driver 120 are configured to receive input voltages from power sources such as power supply (not shown) and/or ground, and the input voltages are regard as the voltage V1 and the voltage V2. However, the scope of the disclosure is not intended to be limited in such power sources, and other suitable power sources are within the contemplated scope of the present disclosure.

With reference to the method 200 in FIG. 2, in operation 220, when a voltage difference between the voltage V1 and the voltage V2 is higher than a voltage threshold Vth1, the ESD driver 120 outputs a first trigger signal to turn on the ESD protection switch 110. In some embodiments, for preventing an electronic device from being damaged by an overvoltage which is introduced by an ESD event, the voltage threshold Vth1 is set in advance. The voltage threshold Vth1 is set according to actual requirements. For example, if a normal operation voltage of the electronic device is about 5V (volt), the voltage threshold Vth1 is set to be about 10V. Therefore, when the overvoltage is higher than the voltage threshold Vth1, and the overvoltage is conduced to ground or virtual ground by the ESD protection switch 110. However, the scope of the disclosure is not intended to be limited in such threshold (e.g., 10V), and other suitable threshold is within the contemplated scope of the present disclosure.

In some embodiments, when an ESD event occurs, an overvoltage is generated and input into the terminal T1 of the ESD driver 120. Therefore, the voltage difference between the voltage V1 and the voltage V2 is higher than the voltage threshold Vth1, and the ESD driver 120 outputs a first trigger signal to turn on the ESD protection switch 110. Subsequently, the overvoltage is conducted to ground or virtual ground by the ESD protection switch 110. Hence, the overvoltage does not input in the electronic device, and the electronic device will not be damaged.

In various embodiments, when an ESD event occurs, an overvoltage, for example, 15V, is generated and input into the terminal T1 of the ESD driver 120. The terminal T1 of the ESD driver 120 receives the overvoltage, and the overvoltage is regard as the voltage V1. Meanwhile, the terminal T2 of the ESD driver 120 is grounded, and the voltage V2 is about 0V. Therefore, the voltage difference between the voltage V1 and the voltage V2 is, for example, 15V, and the voltage difference is higher than the voltage threshold Vth1, for example, 10V. In this condition, the ESD driver 120 outputs a first trigger signal to turn on the ESD protection switch 110. Subsequently, the overvoltage is conducted to ground or virtual ground by the ESD protection switch 110 for preventing the electronic device from being damaged. However, the scope of the disclosure is not intended to be limited in such overvoltage and threshold, and other overvoltage and suitable threshold are within the contemplated scope of the present disclosure.

With reference to the method 200 in FIG. 2, in operation 230, when a voltage difference between the voltage V1 and the voltage V2 is lower than a voltage threshold Vth2, the ESD driver 120 outputs a second trigger signal to turn on the ESD protection switch 110. In some embodiments, when an ESD event occurs, an overvoltage is therefore introduced and will be input into the terminal T1 or the terminal T2. For preventing an electronic device from being damaged by the overvoltage which is input into the terminal T2 of the ESD driver 120, the voltage threshold Vth2 is set in advance. The voltage threshold Vth2 is set according to actual requirements. For example, if a normal operation voltage of the electronic device is about 5V, the voltage threshold is set to be about 10V. However, if the overvoltage is input into the terminal T2, a voltage difference made by the voltage V1 minus the voltage V2 is a negative number. Therefore, the voltage threshold Vth2 is set to be about −10V. Hence, when the overvoltage is lower than the voltage threshold Vth2, the overvoltage is conduced into ground or virtual ground by the ESD protection switch 110. However, the scope of the disclosure is not intended to be limited in such threshold (e.g., −10V), and other suitable threshold is within the contemplated scope of the present disclosure.

In some embodiments, when an ESD event occurs, an overvoltage is generated and input into the terminal T2 of the ESD driver 120. Therefore, the voltage difference made by the voltage V1 minus the voltage V2 is lower than the voltage threshold Vth2, and the ESD driver 120 outputs a second trigger signal to turn on the ESD protection switch 110. Subsequently, the overvoltage is conducted to ground or virtual ground by the ESD protection switch 110. Hence, the overvoltage does not input in the electronic device, and the electronic device will not be damaged.

In some embodiments, when an ESD event occurs, an overvoltage, for example, 15V, is generated and input into the terminal T2 of the ESD driver 120. The terminal T2 of the ESD driver 120 receives the overvoltage, and the overvoltage is regard as the voltage V2. Meanwhile, the terminal T1 of the ESD driver 120 is grounded, and the voltage V1 is about 0V. Therefore, the voltage difference made by the voltage V1 minus the voltage V2 is, for example, −15V, and the voltage difference is lower than the voltage threshold Vth2, for example, −10V. In this condition, the ESD driver 120 outputs a second trigger signal to turn on the ESD protection switch 110. Subsequently, the overvoltage is conducted to ground or virtual ground by the ESD protection switch 110 for preventing an electronic device from being damaged. However, the scope of the disclosure is not intended to be limited in such overvoltage and threshold, and other overvoltage and suitable threshold are within the contemplated scope of the present disclosure.

In view of the above, when an overvoltage is generated and input into the terminal T1 of the ESD driver 120 or when an overvoltage is generated and input into the terminal T2 of the ESD driver 120, the ESD driver 120 of the ESD protection device 100 turns on the ESD protection switch 110, such that the overvoltage is conducted to ground or virtual ground to prevent an electronic device from being damaged. Hence, the ESD protection device 100 as shown in FIG. 1 is able to deal with bidirectional ESD current.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As illustratively shown in FIG. 1, the ESD driver 120 includes a control circuit 121, a trigger circuit 123, a trigger circuit 125, a voltage regulator 127, a voltage regulator 129, a resistor R1, and a resistor R2. The trigger circuit 123 includes an input terminal IN1 and an output terminal O1. The trigger circuit 125 includes an input terminal IN2 and an output terminal O2.

In some embodiments, the control circuit 121 is coupled to the ESD protection switch 110. The trigger circuit 123 and the control circuit 121 are coupled to each other at a node N1. The trigger circuit 125 and the control circuit 121 are coupled to each other at a node N2.

As illustratively shown in FIG. 1, the voltage regulator 127 is coupled to the trigger circuit 123 in parallel. The voltage regulator 129 is coupled to the trigger circuit 125 in parallel. The resistor R1 and the trigger circuit 123 are coupled to each other at the node N1. The resistor R2 and the trigger circuit 125 are coupled to each other at the node N2.

One terminal of the control circuit 121, one terminal of the trigger circuit 123, one terminal of the voltage regulator 127, and one terminal of the resistor R2 are coupled to a terminal T1. The terminal T1 is coupled to power sources such as power supply or ground.

Another terminal of the control circuit 121, one terminal of the trigger circuit 125, one terminal of the voltage regulator 129, and one terminal of the resistor R1 are coupled to a terminal T2. The terminal T2 is coupled to power sources such as power supply or ground.

The above discussion merely describes exemplary connections that can be made in accordance with various alternative embodiments. It is understood that such various alternative embodiments are not limited to the specific connections described above or those shown in FIG. 1.

Figure 3:
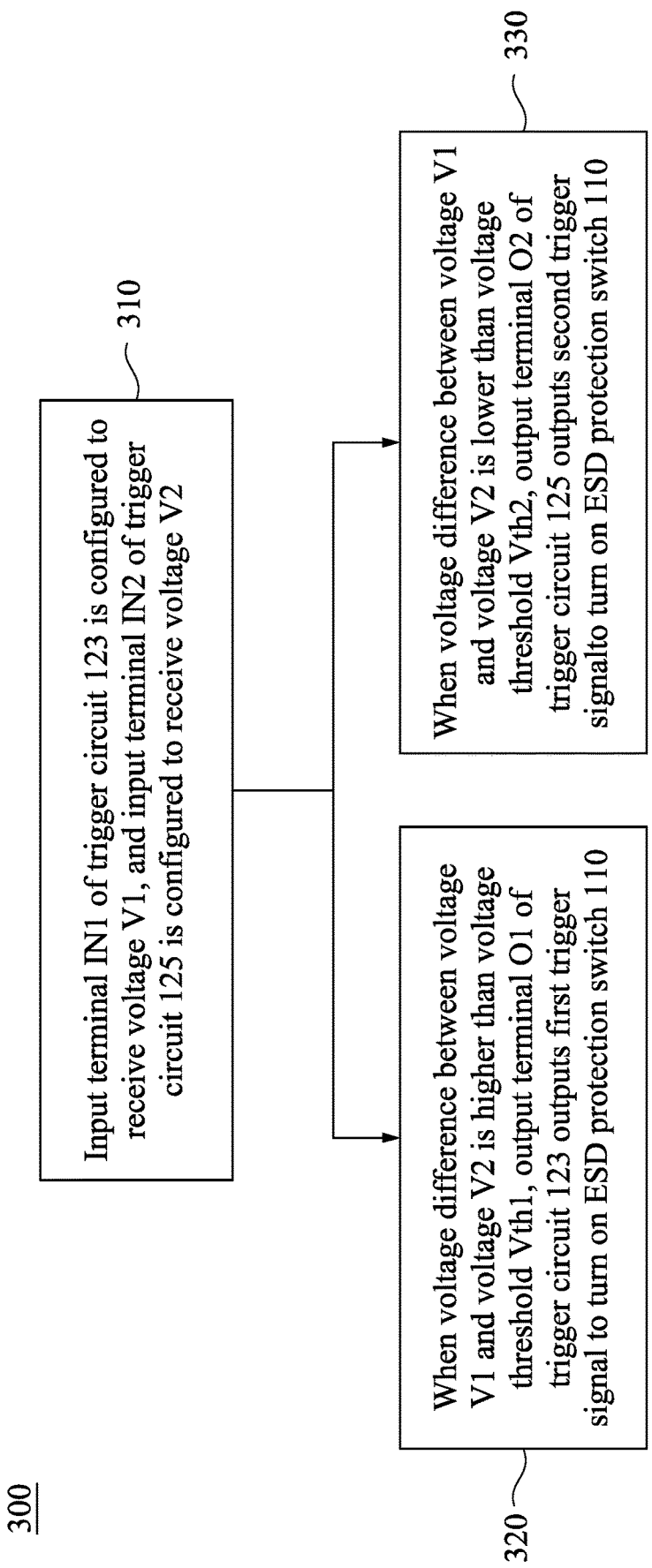
FIG. 3 is a flow chart of a method for operating the ESD protection device as shown in FIG. 1 in accordance with various embodiments of the present disclosure.

Reference is now made to FIG. 3. FIG. 3 is a flow chart of a method 300 for operating the ESD protection device 100 in FIG. 1, in accordance with various embodiments of the present disclosure. For illustration, the operations of the ESD protection device 100 in FIG. 1 are described by the method 300.

With reference to the method 300 in FIG. 3, in operation 310, the input terminal IN1 of the trigger circuit 123 is configured to receive the voltage V1, and the input terminal IN2 of the trigger circuit 125 is configured to receive the voltage V2. In some embodiments, the ESD protection device 100 is implemented in an input of an electronic device for preventing an electronic device from being damaged by an overvoltage which is introduced by an ESD event. The input terminal IN1 of the trigger circuit 123 and the input terminal IN2 of the trigger circuit 125 are configured to receive input voltages from power sources such as power supply and/or ground, and the input voltages are regard as the voltage V1 and the voltage V2. However, the scope of the disclosure is not intended to be limited in such power sources, and other suitable power sources are within the contemplated scope of the present disclosure.

With reference to the method 300 in FIG. 3, in operation 320, when a voltage difference between the voltage V1 and the voltage V2 is higher than a voltage threshold Vth1, the output terminal O1 of the trigger circuit 123 outputs the first trigger signal to turn on the ESD protection switch 110. In some embodiments, for preventing an electronic device from being damaged by an overvoltage which is introduced by an ESD event, the voltage threshold Vth1 is set in advance. The voltage threshold Vth1 is set according to actual requirements. For example, if a normal operation voltage of the electronic device is about 5V, the voltage threshold Vth1 is set to be about 10V. Therefore, when the overvoltage is higher than the voltage threshold Vth1, the output terminal O1 of the trigger circuit 123 outputs the first trigger signal to turn on the ESD protection switch 110, and the overvoltage is conducted to ground or virtual ground by the ESD protection switch 110. However, the scope of the disclosure is not intended to be limited in such threshold (e.g., 10V), and other suitable threshold is within the contemplated scope of the present disclosure.

In some embodiments, the voltage regulator 129 is configured to regulate a voltage of the input terminal IN2 and a voltage of the output terminal O2 to be substantially the same. When an ESD event occurs, the voltage difference between the voltage V1 and the voltage V2 is higher than the voltage threshold Vth1, and the voltage regulator 129 is configured to regulate a voltage of the input terminal IN2 and a voltage of the output terminal O2 to be substantially the same. At this time, voltages at two terminals of the trigger circuit 125 are substantially the same, and the trigger circuit 125 does not output any signal. Meanwhile, the output terminal O1 of the trigger circuit 123 outputs the first trigger signal to the control circuit 121 in response to an ESD event. Subsequently, the control circuit 121 turns on the ESD protection switch 110 according to the first trigger signal. Therefore, the overvoltage is conducted to ground or virtual ground by the ESD protection switch 110 for preventing an electronic device from being damaged.

With reference to the method 300 in FIG. 3, in operation 330, when the voltage difference between the voltage V1 and the voltage V2 is lower than the voltage threshold Vth2, the output terminal O2 of the trigger circuit 125 outputs the second trigger signal to turn on the ESD protection switch 110. In some embodiments, when an ESD event occurs, an overvoltage is therefore introduced and will be input into the terminal T1 or the terminal T2. For preventing an electronic device from being damaged by the overvoltage which is input into the terminal T2, the voltage threshold Vth2 is set in advance. The voltage threshold Vth2 is set according to actual requirements. For example, if a normal operation voltage of the electronic device is about 5V, the voltage threshold is set to be about 10V. However, if the overvoltage is input into the terminal T2, a voltage difference made by the voltage V1 minus the voltage V2 is a negative number. Therefore, the voltage threshold Vth2 is set to be about −10V. Hence, when the overvoltage is lower than the voltage threshold Vth2, the output terminal O2 of the trigger circuit 125 outputs the second trigger signal to turn on the ESD protection switch 110, and the overvoltage is conduced into ground or virtual ground by the ESD protection switch 110. However, the scope of the disclosure is not intended to be limited in such threshold (e.g., −10V), and other suitable threshold is within the contemplated scope of the present disclosure.

In some embodiments, the voltage regulator 127 is configured to regulate a voltage of the input terminal IN1 and a voltage of the output terminal O1 to be substantially the same. When an ESD event occurs, the voltage difference between the voltage V1 and the voltage V2 is lower than the voltage threshold Vth2, and the voltage regulator 127 is configured to regulate a voltage of the input terminal IN1 and a voltage of the output terminal O1 to be substantially the same. At this time, voltages at two terminals of the trigger circuit 123 are substantially the same, and the trigger circuit 123 does not output any signal. Meanwhile, the output terminal O2 of the trigger circuit 125 outputs the second trigger signal to the control circuit 121 in response to an ESD event. Subsequently, the control circuit 121 turns on the ESD protection switch 110 according to the second trigger signal. Therefore, the overvoltage is conducted to ground or virtual ground by the ESD protection switch 110 for preventing an electronic device from being damaged.

Figure 4:
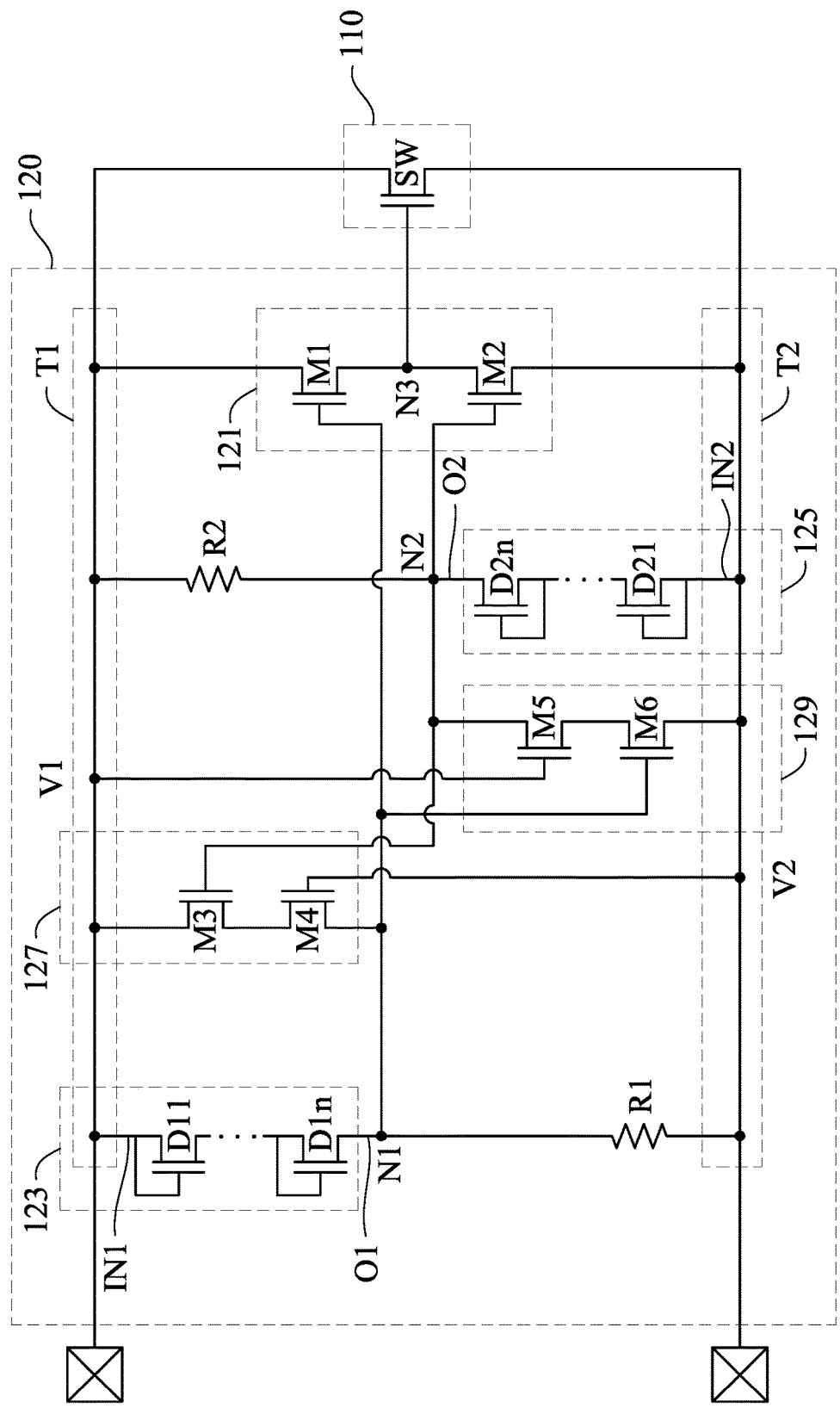
FIG. 4 is a circuit diagram of the ESD protection device as shown in FIG. 1 in accordance with some embodiments.

FIG. 4 is a circuit diagram of the ESD protection device 100 as shown in FIG. 1 in accordance with some embodiments.

As illustratively shown in FIG. 4, the ESD protection switch 110 includes a ESD protection transistor SW, and the control circuit 121 includes a transistor M1 and a transistor M2. The transistor M1 and the transistor M2 are coupled to each other in series, and one terminal of the transistor M1 and one terminal of the transistor M2 are coupled at a node N3. The node N3 is coupled to a control terminal of the ESD protection transistor SW. Another terminal of the transistor M1 is coupled to the terminal T1, and another terminal of the transistor M2 is coupled to the terminal T2.

The trigger circuit 123 includes at least one transistor D11. One terminal of the transistor D11 and a control terminal of the transistor D11 are coupled to the terminal T1. Another terminal of the transistor D11 is coupled to the node N1, and the node N1 is coupled to a control terminal of the transistor M1. However, the scope of the disclosure is not intended to be limited in implementing the trigger circuit 123 by transistors, and implementing the trigger circuit 123 by other suitable electrical elements is within the contemplated scope of the present disclosure. In some embodiments, one terminal of the resistor R1 is coupled to the node N1, and another terminal of the resistor R1 is coupled to the terminal T2.

Reference is now made to FIG. 4, the voltage regulator 127 includes a pull down circuit. The pull down circuit 127 is coupled to the trigger circuit 123 in parallel.

In some embodiments, the pull down circuit 127 includes a transistor M3 and a transistor M4. One terminal of the transistor M3 is coupled to the terminal T1, a control terminal of the transistor M3 is coupled to the node N2, and another terminal of the transistor M3 is coupled to one terminal of the transistor M4. Another terminal of the transistor M4 is coupled to the node N1, and a control terminal of the transistor M4 is coupled to the terminal T2.

As illustratively shown in FIG. 4, the trigger circuit 125 includes at least one transistor D21. One terminal of the transistor D21 and a control terminal of the transistor D21 are coupled to the terminal T2. Another terminal of the transistor D21 is coupled to the node N2, and the node N2 is coupled to a control terminal of the transistor M2. However, the scope of the disclosure is not intended to be limited in implementing the trigger circuit 125 by transistors, and implementing the trigger circuit 125 by other suitable electrical elements is within the contemplated scope of the present disclosure. In some embodiments, one terminal of the resistor R2 is coupled to the node N2, and another terminal of the resistor R2 is coupled to the terminal T1.

Reference is now made to FIG. 4, the voltage regulator 129 includes a pull down circuit. The pull down circuit 129 is coupled to the trigger circuit 125 in parallel.

In some embodiments, the pull down circuit 129 includes a transistor M5 and a transistor M6. One terminal of the transistor M6 is coupled to the terminal T2, a control terminal of the transistor M6 is coupled to the node N1, and another terminal of the transistor M6 is coupled to one terminal of the transistor M5. Another terminal of the transistor M5 is coupled to the node N2, and a control terminal of the transistor M5 is coupled to the terminal T1.

In some embodiments, the above-mentioned transistor includes a Bipolar Junction Transistor (BJT), a Metal Oxide Semiconductor Field Effect Transistor (MOSFET), or an Insulated Gate Bipolar Transistor (IGBT).

The above discussion merely describes exemplary connections that can be made in accordance with various alternative embodiments. It is understood that such various alternative embodiments are not limited to the specific connections described above or those shown in FIG. 4.

Figure 5:
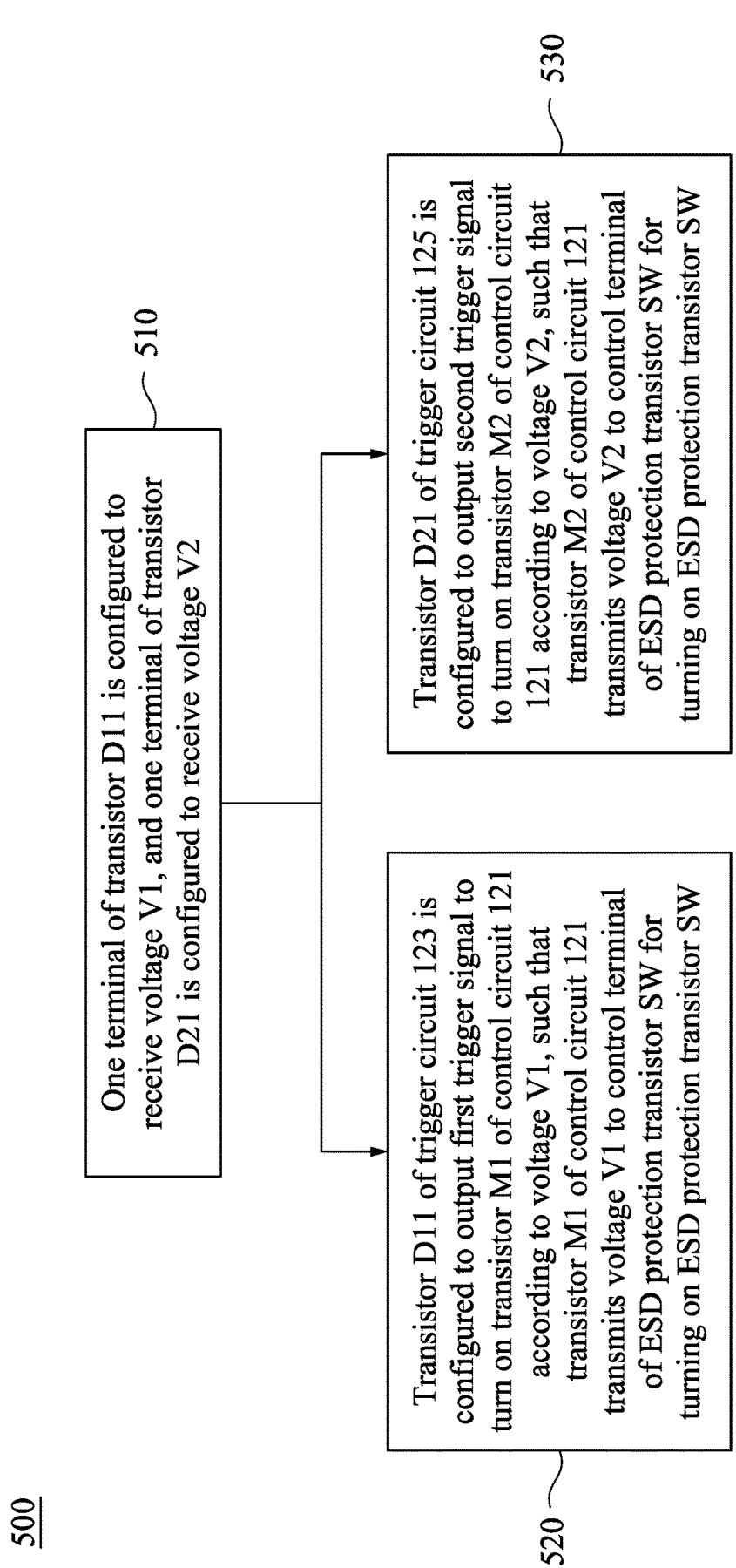
FIG. 5 is a flow chart of a method for operating the ESD protection device as shown in FIG. 4 in accordance with various embodiments of the present disclosure.

Reference is now made to FIG. 5. FIG. 5 is a flow chart of a method 500 for operating the ESD protection device 100 in FIG. 4, in accordance with various embodiments of the present disclosure. For illustration, the operations of the ESD protection device 100 in FIG. 4 are described by the method 500.

With reference to the method 500 in FIG. 5, in operation 510, one terminal of the transistor D11 is configured to receive the voltage V1, and one terminal of the transistor D21 is configured to receive the voltage V2. In some embodiments, the ESD protection device 100 is implemented in an input of an electronic device for preventing an electronic device from being damaged by an overvoltage which is introduced by an ESD event. The transistor D11 of the trigger circuit 123 and the transistor D21 of the trigger circuit 125 are configured to receive input voltages from power sources such as power supply and/or ground, and the input voltages are regard as the voltage V1 and the voltage V2. However, the scope of the disclosure is not intended to be limited in such power sources, and other suitable power sources are within the contemplated scope of the present disclosure.

With reference to the method 500 in FIG. 5, in operation 520, the transistor D11 of the trigger circuit 123 is configured to output a first trigger signal to turn on the transistor M1 of the control circuit 121 according to the voltage V1, such that the transistor M1 of the control circuit 121 transmits the voltage V1 to the control terminal of the ESD protection transistor SW for turning on the ESD protection transistor SW.

In some embodiments, the transistor D11 of the trigger circuit 123 outputs the first trigger signal according to the voltage V1 and a threshold voltage Vth1 of the transistor D11. In some embodiments, for preventing an electronic device from being damaged by an overvoltage which is introduced by an ESD event, the voltage threshold Vth1 is set in advance. The voltage threshold Vth1 is set according to actual requirements. For example, if a normal operation voltage of the electronic device is about 5V, the voltage threshold Vth1 is set to be about 10V. In order to set the voltage threshold Vth1 to be about 10V, multiple transistors are coupled to each other in series. For example, the threshold of each of the transistors is 2V, and five transistors coupled to each other in series can provide a threshold about 10V. As illustratively shown in FIG. 4, the trigger circuit 123 includes a plurality of transistors D11-D1n coupled to each other in series. If the threshold of each of the plurality of transistors D11-D1n is 2V, the trigger circuit 123 may include five of plurality of transistors D11-D1n, and the voltage threshold Vth1 of the trigger circuit 123 is about 10V. However, the scope of the disclosure is not intended to be limited in such threshold (e.g., 10V), and other suitable threshold is within the contemplated scope of the present disclosure.

In various embodiments, when an ESD event occurs, an overvoltage, for example, 15V, is generated and input into the terminal T1 of the ESD driver 120. If the overvoltage is higher than the voltage threshold Vth1, for example, 10V, of the transistors D11-D1n of the trigger circuit 123, the transistors D11-D1n of the trigger circuit 123 are configured to output a first trigger signal to turn on the transistor M1 of the control circuit 121. Subsequently, the voltage V1 is transmitted to the control terminal of the ESD protection transistor SW by the transistor M1. Therefore, the ESD protection transistor SW is turned on by the voltage V1, and the overvoltage is conduced to ground or virtual ground by the ESD protection transistor SW. However, the scope of the disclosure is not intended to be limited in such overvoltage and threshold, and other overvoltage and suitable threshold are within the contemplated scope of the present disclosure.

In some embodiments, when an overvoltage, for example, 15V, is generated and input into the terminal T1 of the ESD driver 120 in response to an ESD event, the transistor M5 is turned on according to the voltage V1 from the terminal T1 and the transistor M6 is turned on according to the voltage V1 transmitted by the trigger circuit 123 from the terminal T1 to the node N1. Therefore, both of the transistor M5 and transistor M6 of the pull down circuit 129 are turned on, and a voltage across the trigger circuit 125 is pulled down to the terminal T2. Hence, the trigger circuit 125 does not output any signal.

With reference to the method 500 in FIG. 5, in operation 530, the transistor D21 of the trigger circuit 125 is configured to output a second trigger signal to turn on the transistor M2 of the control circuit 121 according to the voltage V2, such that the transistor M2 of the control circuit 121 transmits the voltage V2 to the control terminal of the ESD protection transistor SW for turning on the ESD protection transistor SW.

In some embodiments, the transistor D21 of the trigger circuit 125 outputs the second trigger signal according to the voltage V2 and a threshold voltage Vth2 of the transistor D21. In some embodiments, for preventing an electronic device from being damaged by an overvoltage which is introduced by an ESD event, the voltage threshold Vth2 is set in advance. The voltage threshold Vth2 is set according to actual requirements. For example, if a normal operation voltage of the electronic device is about 5V, the voltage threshold Vth2 is set to be about 10V. In order to set the voltage threshold Vth2 to be about 10V, multiple transistors are coupled to each other in series. For example, the threshold of each of the transistors is 2V, and five transistors coupled to each other in series can provide a threshold about 10V. As illustratively shown in FIG. 4, the trigger circuit 125 includes a plurality of transistors D21-D2n coupled to each other in series. If the threshold of each of the plurality of transistors D21-D2n is 2V, the trigger circuit 125 may include five of plurality of transistors D21-D2n, and the voltage threshold Vth2 of the trigger circuit 125 is about 10V. However, the scope of the disclosure is not intended to be limited in such threshold (e.g., 10V), and other suitable threshold is within the contemplated scope of the present disclosure.

In various embodiments, when an ESD event occurs, an overvoltage, for example, 15V, is generated and input into the terminal T2 of the ESD driver 120. If the overvoltage is higher than the voltage threshold Vth2, for example, 10V, of the transistors D21-D2n of the trigger circuit 125, the transistors D21-D2n of the trigger circuit 125 are configured to output a second trigger signal to turn on the transistor M2 of the control circuit 121. Subsequently, the voltage V2 is transmitted to the control terminal of the ESD protection transistor SW by the transistor M2. Therefore, the ESD protection transistor SW is turned on by the voltage V2, and the overvoltage is conduced to ground or virtual ground by the ESD protection transistor SW. However, the scope of the disclosure is not intended to be limited in such overvoltage and threshold, and other overvoltage and suitable threshold are within the contemplated scope of the present disclosure.

In some embodiments, when an overvoltage, for example, 15V, is generated and input into the terminal T2 of the ESD driver 120 in response to an ESD event, the transistor M3 is turned on according to the voltage V2 transmitted by the trigger circuit 125 from the terminal T2 to the node N2 and the transistor M4 is turned on according to the voltage V2 from the terminal T2. Therefore, both of the transistor M3 and transistor M4 of the pull down circuit 127 are turned on, and a voltage across the trigger circuit 123 is pulled down to the terminal T1. Hence, the trigger circuit 123 does not output any signal.

In view of the above, when an overvoltage, for example, 15V, inputs into the terminal T1 or the terminal T2 of the ESD protection device 100, the ESD protection device 100 turns on the ESD protection transistor SW, such that the overvoltage is conducted from the terminal T1 or the terminal T2 to ground to prevent an electronic device from being damaged. Hence, the ESD protection device 100 as shown in FIG. 4 is able to deal with bidirectional ESD current.

Also disclosed is a device. The device includes an ESD protection switch and an ESD driver. The ESD driver is configured to receive a first voltage and a second voltage. When a voltage difference between the first voltage and the second voltage is higher than a first voltage threshold, the ESD driver outputs a first trigger signal to turn on the ESD protection switch. When the voltage difference between the first voltage and the second voltage is lower than a second voltage threshold, the ESD driver outputs a second trigger signal to turn on the ESD protection switch.

In some embodiments, the ESD driver includes a first trigger circuit. The first trigger circuit includes a first input terminal and a first output terminal. The first input terminal of the first trigger circuit is configured to receive the first voltage. When the voltage difference between the first voltage and the second voltage is higher than the first voltage threshold, the first output terminal of the first trigger circuit outputs the first trigger signal.

In various embodiments, the ESD driver includes a second trigger circuit. The second trigger circuit includes a second input terminal and a second output terminal. The second input terminal of the second trigger circuit is configured to receive the second voltage. When the voltage difference between the first voltage and the second voltage is lower than the second voltage threshold, the second output terminal of the second trigger circuit outputs the second trigger signal.

In some embodiments, the ESD driver further includes a first voltage regulator. The first voltage regulator is coupled to the first trigger circuit in parallel, and configured to regulate a voltage of the first input terminal and a voltage of the first output terminal to be substantially the same.

In various embodiments, the ESD driver further includes a second voltage regulator. The second voltage regulator is coupled to the second trigger circuit in parallel, and configured to regulate a voltage of the second input terminal and a voltage of the second output terminal to be substantially the same.

In some embodiments, when the voltage difference between the first voltage and the second voltage is higher than the first voltage threshold, the second voltage regulator is configured to regulate a voltage of the second input terminal and a voltage of the second output terminal to be substantially the same, and the first output terminal outputs the first trigger signal to turn on the ESD protection switch.

In various embodiments, when the voltage difference between the first voltage and the second voltage is lower than the second voltage threshold, the first voltage regulator is configured to regulate a voltage of the first input terminal and a voltage of the first output terminal to be substantially the same, and the second output terminal outputs the second trigger signal to turn on the ESD protection switch.

Also disclosed is a device. The device includes an ESD protection transistor and an ESD driver. The ESD driver includes a first transistor, a second transistor, a first trigger circuit, and a second trigger circuit. The first transistor is configured to receive a first voltage. The second transistor is coupled to the first transistor at a node which is coupled to a control terminal of the ESD protection transistor, and configured to receive a second voltage. The first trigger circuit is configured to output a first trigger signal to turn on the first transistor according to the first voltage, such that the first transistor transmits the first voltage to the control terminal of the ESD protection transistor. The second trigger circuit is configured to output a second trigger signal to turn on the second transistor according to the second voltage, such that the second transistor transmits the second voltage to the control terminal of the ESD protection transistor.

In some embodiments, the first trigger circuit includes at least one transistor, and the first trigger circuit outputs the first trigger signal according to the first voltage and a threshold voltage of the at least one transistor.

In various embodiments, when a voltage difference between the first voltage and the second voltage is higher than the threshold voltage of the at least one transistor, the first trigger circuit outputs the first trigger signal.

In some embodiments, the second trigger circuit includes at least one transistor, and the second trigger circuit outputs the second trigger signal according to the second voltage and a threshold voltage of the at least one transistor.

In various embodiments, when a voltage difference between the first voltage and the second voltage is lower than the threshold voltage of the at least one transistor, the second trigger circuit outputs the second trigger signal.

In some embodiments, the ESD driver further includes a first pull down circuit. The first pull down circuit is coupled to the first trigger circuit in parallel, and configured to pull down a voltage across the first trigger circuit.

In various embodiments, the ESD driver further includes a second pull down circuit, and the second pull down circuit is coupled to the second trigger circuit in parallel, and configured to pull down a voltage across the second trigger circuit.

Also disclosed is a method. The method includes: outputting a first trigger signal to turn on an ESD protection switch when a voltage difference between a first voltage and a second voltage is higher than a first voltage threshold; and outputting a second trigger signal to turn on the ESD protection switch when the voltage difference between the first voltage and the second voltage is lower than a second voltage threshold.

In some embodiments, outputting the first trigger signal to turn on the ESD protection switch when the voltage difference between the first voltage and the second voltage is higher than the first voltage threshold includes: outputting the first trigger signal by a first output terminal of a first trigger circuit when the voltage difference between the first voltage and the second voltage is higher than the first voltage threshold of at least one first transistor of the first trigger circuit.

In various embodiments, outputting the second trigger signal to turn on the ESD protection switch when the voltage difference between the first voltage and the second voltage is lower than the second voltage threshold includes: outputting the second trigger signal by a second output terminal of a second trigger circuit when the voltage difference between the first voltage and the second voltage is lower than the second voltage threshold of at least one second transistor of the second trigger circuit.

In some embodiments, the method further includes: pulling down a voltage across the first trigger circuit; and pulling down a voltage across the second trigger circuit.

In various embodiments, pulling down a voltage across the second trigger circuit includes: pulling down a voltage across the second trigger circuit when the voltage difference between the first voltage and the second voltage is higher than the first voltage threshold.

In some embodiments, pulling down a voltage across the second trigger circuit includes: pulling down a voltage across the second trigger circuit when the voltage difference between the first voltage and the second voltage is lower than the first voltage threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   an electrostatic discharge (ESD) protection switch; and
   an ESD driver configured to receive a first voltage at a first terminal and receive a second voltage at a second terminal;
   wherein when the first voltage received at the first terminal is a first overvoltage and a voltage difference between the first voltage and the second voltage is higher than a first voltage threshold, the ESD driver outputs a first trigger signal to turn on the ESD protection switch;
   wherein when the second voltage received at the second terminal is a second overvoltage and the voltage difference between the first voltage and the second voltage is lower than a second voltage threshold, the ESD driver outputs a second trigger signal to turn on the ESD protection switch.

2. The device of claim 1, wherein the ESD driver comprises:
   a first trigger circuit, comprising:
      a first input terminal configured to receive the first voltage; and
      a first output terminal, wherein when the voltage difference between the first voltage and the second voltage is higher than the first voltage threshold, the first output terminal outputs the first trigger signal.

3. The device of claim 2, wherein the ESD driver further comprises:
   a second trigger circuit, comprising:
      a second input terminal configured to receive the second voltage; and
      a second output terminal, wherein when the voltage difference between the first voltage and the second voltage is lower than the second voltage threshold, the second output terminal outputs the second trigger signal.

4. The device of claim 3, wherein the ESD driver further comprises:
   a first voltage regulator coupled to the first trigger circuit in parallel, and configured to regulate a voltage of the first input terminal and a voltage of the first output terminal to be substantially the same.

5. The device of claim 4, wherein the ESD driver further comprises:
   a second voltage regulator coupled to the second trigger circuit in parallel, and configured to regulate a voltage of the second input terminal and a voltage of the second output terminal to be substantially the same.

6. The device of claim 5, wherein when the voltage difference between the first voltage and the second voltage is higher than the first voltage threshold, the second voltage regulator is configured to regulate a voltage of the second input terminal and a voltage of the second output terminal to be substantially the same, and the first output terminal outputs the first trigger signal to turn on the ESD protection switch.

7. The device of claim 6, wherein when the voltage difference between the first voltage and the second voltage is lower than the second voltage threshold, the first voltage regulator is configured to regulate a voltage of the first input terminal and a voltage of the first output terminal to be substantially the same, and the second output terminal outputs the second trigger signal to turn on the ESD protection switch.

8. A device, comprising:
   an ESD protection transistor; and
   an ESD driver, comprising:
      a first transistor configured to receive a first voltage;
      a second transistor coupled to the first transistor at a node which is coupled to a control terminal of the ESD protection transistor, and configured to receive a second voltage;
      a first trigger circuit configured to output a first trigger signal to turn on the first transistor according to the first voltage, such that the first transistor transmits the first voltage to the control terminal of the ESD protection transistor; and a second trigger circuit configured to output a second trigger signal to turn on the second transistor according to the second voltage, such that the second transistor transmits the second voltage to the control terminal of the ESD protection transistor.

9. The device of claim 8, wherein the first trigger circuit comprises at least one transistor, the first trigger circuit outputs the first trigger signal according to the first voltage and a threshold voltage of the at least one transistor.

10. The device of claim 9, wherein when a voltage difference between the first voltage and the second voltage is higher than the threshold voltage of the at least one transistor, the first trigger circuit outputs the first trigger signal.

11. The device of claim 8, wherein the second trigger circuit comprises at least one transistor, the second trigger circuit outputs the second trigger signal according to the second voltage and a threshold voltage of the at least one transistor.

12. The device of claim 11, wherein when a voltage difference between the first voltage and the second voltage is lower than the threshold voltage of the at least one transistor, the second trigger circuit outputs the second trigger signal.

13. The device of claim 8, wherein the ESD driver further comprises:
a first pull down circuit coupled to the first trigger circuit in parallel, and configured to pull down a voltage across the first trigger circuit.

14. The device of claim 13, wherein the ESD driver further comprises:
a second pull down circuit coupled to the second trigger circuit in parallel, and configured to pull down a voltage across the second trigger circuit.

15. A method, comprising:
outputting a first trigger signal to turn on an ESD protection switch when a first voltage received at a first terminal is a first overvoltage and a voltage difference between the first voltage received at the first terminal and a second voltage received at a second terminal is higher than a first voltage threshold; and
outputting a second trigger signal to turn on the ESD protection switch when the second voltage at the second terminal is a second overvoltage and the voltage difference between the first voltage received at the first terminal and the second voltage received at the second terminal is lower than a second voltage threshold.

16. The method of claim 15, wherein outputting the first trigger signal to turn on the ESD protection switch when the voltage difference between the first voltage and the second voltage is higher than the first voltage threshold comprises:
outputting the first trigger signal by a first output terminal of a first trigger circuit when the voltage difference between the first voltage and the second voltage is higher than the first voltage threshold of at least one first transistor of the first trigger circuit.

17. The method of claim 16, wherein outputting the second trigger signal to turn on the ESD protection switch when the voltage difference between the first voltage and the second voltage is lower than the second voltage threshold comprises:
outputting the second trigger signal by a second output terminal of a second trigger circuit when the voltage difference between the first voltage and the second voltage is lower than the second voltage threshold of at least one second transistor of the second trigger circuit.

18. The method of claim 17, further comprising:
pulling down a voltage across the first trigger circuit; and
pulling down a voltage across the second trigger circuit.

19. The method of claim 18, wherein pulling down a voltage across the second trigger circuit comprises:
pulling down a voltage across the second trigger circuit when the voltage difference between the first voltage and the second voltage is higher than the first voltage threshold.

20. The method of claim 19, wherein pulling down a voltage across the second trigger circuit comprises:
pulling down a voltage across the second trigger circuit when the voltage difference between the first voltage and the second voltage is lower than the second voltage threshold.

* * * * *